(12) United States Patent
Mizuno et al.

(10) Patent No.: US 12,033,847 B2
(45) Date of Patent: Jul. 9, 2024

(54) CLEANING MODULE, SUBSTRATE PROCESSING APPARATUS INCLUDING CLEANING MODULE, AND CLEANING METHOD

(71) Applicant: EBARA CORPORATION, Tokyo (JP)

(72) Inventors: Toshio Mizuno, Tokyo (JP); Yosuke Himori, Tokyo (JP); Erina Baba, Tokyo (JP); Tomoatsu Ishibashi, Tokyo (JP); Itsuki Kobata, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 477 days.

(21) Appl. No.: 17/294,212

(22) PCT Filed: Oct. 31, 2019

(86) PCT No.: PCT/JP2019/042773
§ 371 (c)(1),
(2) Date: May 14, 2021

(87) PCT Pub. No.: WO2020/100609
PCT Pub. Date: May 22, 2020

(65) Prior Publication Data
US 2022/0013352 A1    Jan. 13, 2022

(30) Foreign Application Priority Data

Nov. 16, 2018 (JP) .................. 2018-215456

(51) Int. Cl.
*B24B 9/06* (2006.01)
*B24B 37/34* (2012.01)
(Continued)

(52) U.S. Cl.
CPC ........ *H01L 21/02087* (2013.01); *B24B 9/065* (2013.01); *B24B 37/345* (2013.01);
(Continued)

(58) Field of Classification Search
None
See application file for complete search history.

(56) References Cited

U.S. PATENT DOCUMENTS

| 5,861,066 A | 1/1999 | Moinpour et al. |
| 2009/0050177 A1 | 2/2009 | Nagayasu et al. |

FOREIGN PATENT DOCUMENTS

| JP | H06-045302 A | 2/1994 |
| JP | H10-335279 A | 12/1998 |
| (Continued) | | |

OTHER PUBLICATIONS

Mori, "JP2010040943A English Machine Translation.pdf", Feb. 18, 2010—Machine translation from Espacenet.com.*

*Primary Examiner* — Levon J Shahinian
(74) *Attorney, Agent, or Firm* — BakerHostetler

(57) ABSTRACT

To perform both buff cleaning of a substrate surface and cleaning of an edge part of the substrate, a cleaning module includes: a rotary table configured to support a circular substrate and have a diameter smaller than a diameter of the substrate; a buff cleaning portion configured to buff clean a front side of the substrate while contacting the front side of the substrate supported by the rotary table; a buff cleaning portion movement mechanism configured to move the buff cleaning portion with respect to the substrate; a buff cleaning portion control mechanism configured to control an operation of the buff cleaning portion movement mechanism; and an edge cleaning portion configured to clean an edge part of the substrate while contacting the edge part of the substrate supported by the rotary table.

12 Claims, 7 Drawing Sheets

(51) Int. Cl.
*B24B 41/06* (2012.01)
*H01L 21/02* (2006.01)
*H01L 21/304* (2006.01)
*H01L 21/67* (2006.01)
*H01L 21/677* (2006.01)
*H01L 21/687* (2006.01)

(52) U.S. Cl.
CPC ............ *B24B 41/06* (2013.01); *H01L 21/304* (2013.01); *H01L 21/67046* (2013.01); *H01L 21/67051* (2013.01); *H01L 21/67092* (2013.01); *H01L 21/67706* (2013.01); *H01L 21/68764* (2013.01)

(56) References Cited

FOREIGN PATENT DOCUMENTS

| JP | 2003-151925 A | 5/2003 |
| JP | 2003-151943 A | 5/2003 |
| JP | 2006-278592 A | 10/2006 |
| JP | 3933670 B2 | 6/2007 |
| JP | 2007-317703 A | 12/2007 |
| JP | 2008-084934 A | 4/2008 |
| JP | 2010-040943 A | 2/2010 |
| JP | 2018-113393 A | 7/2018 |

\* cited by examiner

CLEANING MODULE, SUBSTRATE PROCESSING APPARATUS INCLUDING CLEANING MODULE, AND CLEANING METHOD

TECHNICAL FIELD

The present application claims benefits of priority under Japanese Patent Application No. 2018-215456, filed on Nov. 16, 2018. All disclosures including a specification, claims, drawings, and an abstract of Japanese Patent Application No. 2018-215456 are incorporated herein by reference in their entirety. The present invention relates to a cleaning module, a substrate processing apparatus having the cleaning module, a cleaning module for cleaning an edge part (beveled part) of the substrate, and a cleaning method.

BACKGROUND ART

In the prior art, a device for cleaning an edge part (beveled part) of a substrate is known. Typically, such a cleaning device is used to clean a substrate polished by a device such as a CMP (Chemical Mechanical Polishing) device. PTL 1 (U.S. Pat. No. 5,861,066) discloses a roller for maintaining a substrate in place by contacting an end part of the substrate. The roller is further configured to clean the edge part of the substrate. In addition, in PTL 1, the surface of the substrate is cleaned by a brush separate from the roller.

CITATION LIST

Patent Literature

PTL 1: U.S. Pat. No. 5,861,066

SUMMARY OF INVENTION

Technical Problem

In the device described in PTL 1, mostly, a side surface of the substrate is held by the roller. Therefore, it is considered that, when the substrate receives a force applied in the direction perpendicular to its surface, a positional deviation of the substrate or other problems may occur. Therefore, it is considered difficult to buff clean the surface of the substrate in the device of PTL 1. In this regard, it is an object of the present application to address at least one of the aforementioned problems.

Solution to Problem

According to an embodiment of the present invention, there is disclosed a cleaning module including: a rotary table configured to support a circular substrate and have a diameter smaller than a diameter of the substrate; a buff cleaning portion configured to buff clean a front side of the substrate while contacting the front side of the substrate supported by the rotary table; a buff cleaning portion movement mechanism configured to move the buff cleaning portion with respect to the substrate; a buff cleaning portion control mechanism configured to control an operation of the buff cleaning portion movement mechanism; and an edge cleaning portion configured to clean an edge part of the substrate while contacting the edge part of the substrate supported by the rotary table.

DESCRIPTION OF EMBODIMENTS

Figure 1:
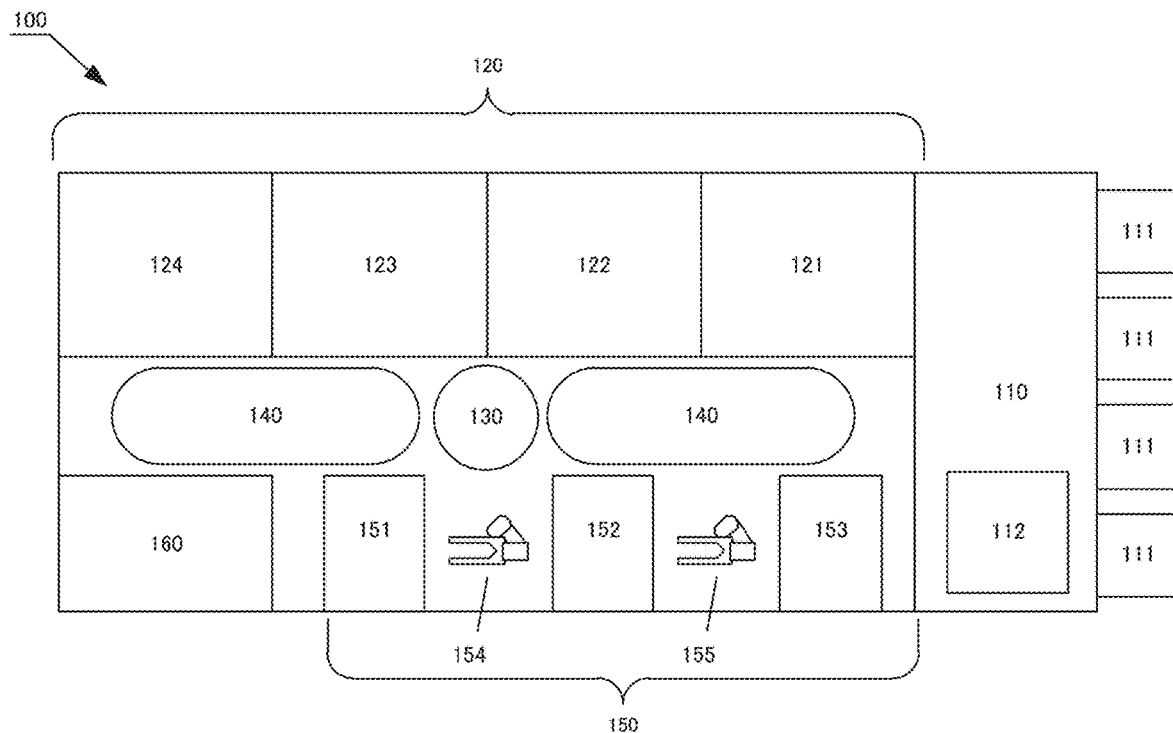
FIG. 1 is a top view illustrating a substrate processing apparatus.

FIG. 1 is a top view illustrating a substrate processing apparatus 100 according to an embodiment. Herein, the term "substrate processing apparatus" refers to an apparatus having at least a substrate polishing function and a substrate cleaning function. Note that FIG. 1 and the other drawings are illustrated merely for schematic purposes. For example, the substrate processing apparatus may have a shape different from that of FIG. 1 in practice. For example, an actual substrate processing apparatus may have elements other than those illustrated in FIG. 1. Specific configurations of the substrate processing apparatus and components of the substrate processing apparatus are not limited to those described below.

The substrate processing apparatus 100 of FIG. 1 has a load/unload portion 110, a polishing portion 120, and a wafer station 130. The substrate processing apparatus 100 further has a substrate transfer unit 140, a substrate cleaning portion 150, and a control unit 160. The load/unload portion 110 may have a FOUP 111 and a transfer robot 112 of the load/unload portion. The polishing portion 120 may have a first polishing device 121, a second polishing device 122, a third polishing device 123, and a fourth polishing device 124. The substrate cleaning portion 150 may have a first cleaning module 151, a second cleaning module 152, and a third cleaning module. The substrate cleaning portion 150 may further have a first cleaning portion transfer robot 154 and a second cleaning portion transfer robot 155.

The load/unload portion 110 is provided to load a substrate to be treated from the outside of the substrate processing apparatus 100 and to unload the treated substrate from the inside of the substrate processing apparatus 100.

The FOUP 111 may house a substrate or a substrate cassette containing the substrate. A transfer robot 112 of the load/unload portion receives/delivers the substrate from/to a desired FOUP 111. The substrate received by the transfer robot 112 of the load/unload portion may be delivered to the polishing portion 120 by the substrate transfer unit 140 described below and/or any other mechanism (not shown).

The polishing portion 120 has a first polishing device 121, a second polishing device 122, a third polishing device 123, and a fourth polishing device 124. Here, the terms such as "first" and "second" are merely for distinction purposes. In other words, the terms such as "first" and "second" may be denoted regardless of the device position or the treatment order, or may be related to the device position or the treatment order as well.

Each of the first to fourth polishing devices 121 to 124 is, for example, a CMP device. Each of the first to fourth polishing devices 121 to 124 has a polishing table (not shown) for mounting a polishing pad and a top ring (not shown) for mounting a substrate. However, each of the first to fourth polishing devices 121 to 124 may be a CMP device having another configuration or a polishing device other than the CMP device. Each of the first to fourth polishing devices 121 to 124 may have a liquid supply device (not shown) for supplying a polishing liquid or the like to the polishing pad. A single liquid supply device may also be configured to supply a liquid to a plurality of polishing devices. A typical CMP device polishes a substrate by pressing the substrate against the polishing pad and rotating at least one, or preferably both, of the polishing table and the top ring.

The substrate polished by the polishing portion 120 is transferred to the wafer station 130. The wafer station 130 is configured to hold the substrate after polishing or before cleaning. The wafer station 130 may be configured to hold a plurality of substrates. The substrate transfer unit 140 is configured to transfer the substrate from the polishing portion 120 to the wafer station 130. Note that, as described above, the substrate transfer unit 140 may be in charge of at least a part of conveyance of the substrate between the load/unload portion 110 and the polishing portion 120.

The substrate held in the wafer station 130 is transferred to the substrate cleaning portion 150. The substrate is transferred between the wafer station 130 and the substrate cleaning portion 150 by the first cleaning portion transfer robot 154. The substrate transferred to the substrate cleaning portion 150 is cleaned by each cleaning module (the first, second, and third cleaning modules 151, 152, and 153). The cleaning module (third cleaning module 153 in the example of FIG. 1) in charge of the final process of cleaning may have a function of drying the substrate, such as a function of rotating the substrate at high speed (spin dry function). Additionally or alternatively, a drying module may also be provided at the rear of the third cleaning module 153. The number of cleaning modules provided in the substrate cleaning portion 150 is not limited to three. The number of cleaning modules may also be one, two, four, or more. Depending on the number and/or arrangement of the cleaning modules, the number and/or arrangement of the cleaning portion transfer robots may be changed.

The first cleaning portion transfer robot 154 receives the polished substrate from the wafer station 130 and transfers the received substrate to the first cleaning module 151. In addition, the first cleaning portion transfer robot 154 receives the substrate cleaned by the first cleaning module 151, and transfers the received substrate to the second cleaning module 152. The second cleaning portion transfer robot 155 receives the substrate cleaned by the second cleaning module 152, and transfers the received substrate to the third cleaning module 153. The substrate cleaned by the third cleaning module 153 is carried outside from the third cleaning module 153 by any means such as the transfer robot 112, the substrate transfer unit 140, the third cleaning module 153, or another transfer device (not shown). The substrate carried outside from the third cleaning module 153 is carried into the load/unload portion 110. The substrate is finally unloaded from the substrate processing apparatus 100 by the load/unload portion 110.

At least one of the first, second, and third cleaning modules 151, 152, and 153 is configured to perform both buff cleaning of the surface of the substrate and cleaning of the edge part of the substrate. Here, the "edge part of the substrate" includes a "chamfered part of the edge part of the substrate", that is, a "beveled part of the substrate". In addition, the "edge part of the substrate" may be paraphrased as "the edge part of the front side of the substrate and the edge part of the back side of the substrate" (definitions of the front side and the back side will be described below).

Figure 2A:
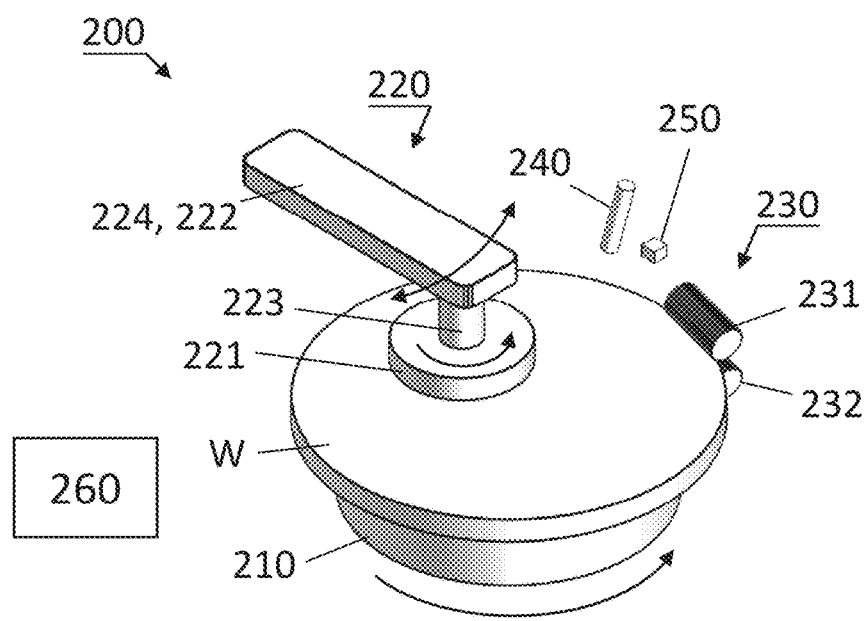
FIG. 2A is a perspective view illustrating a cleaning module according to an embodiment.
Figure 2B:
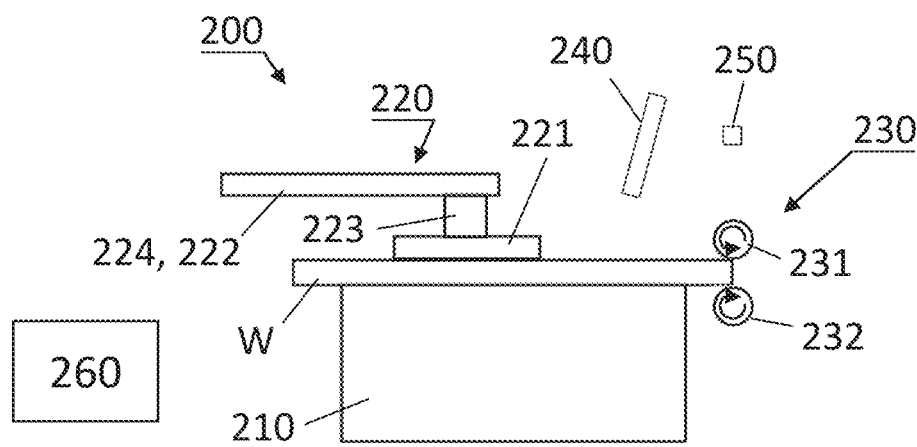
FIG. 2B is a side view illustrating a cleaning module according to an embodiment.

FIG. 2A is a perspective view illustrating the cleaning module 200 capable of both buff cleaning of the surface of the circular substrate W and cleaning of the edge part of the substrate. FIG. 2B is a side view illustrating the cleaning module 200. The cleaning module 200 has a rotary table 210, a buff cleaning portion 220, and an edge cleaning portion 230. The cleaning module 200 may further have a liquid supply mechanism 240 for supplying a cleaning liquid, pure water, or other liquids to the substrate W, a sensor 250, and a control unit 260 for controlling each element of the cleaning module 200. The control unit 260 may be the same as the control unit 160 or may be a part of the control unit 160. Alternatively, the control unit 260 may be independent of the control unit 160. The cleaning module 200 may further have a dresser (not shown) for sharpening a buff pad (not shown) of the buff cleaning portion 220. Hereinafter, it is assumed that the buff cleaned surface of the substrate W faces upward. However, the buff cleaned surface of the substrate W may face any direction other than the upward direction. Furthermore, in the following description, the buff cleaned surface of the substrate W will be referred to as a "front side", and the other surface will be referred to as a "back side".

The rotary table 210 is a member for supporting the substrate W to be cleaned. Preferably, the substrate W is fixed to the rotary table 210 by vacuum suctioning or the like. Typically, the rotary table 210 can be rotated by a motor (not shown) or the like. The diameter of the rotary table 210 is configured to be smaller than the diameter of the substrate W so as not to interfere with the edge cleaning portion 230. It is easier to avoid interference with the edge cleaning portion 230 as the diameter of the rotary table 210 is reduced. On the other hand, it is possible to support the substrate W stronger as the diameter of the rotary table 210 increases. For example, the diameter of the rotary table 210 is set to 70% to 99% of the diameter of the substrate W. The cleaning module 200 may have a mechanism (not shown) for centering the substrate W and the rotary table 210.

The front side of the substrate W is cleaned by the buff cleaning portion 220. The buff cleaning portion 220 cleans the substrate W while contacting the front side of the substrate W. The buff cleaning portion 220 has a buff head 221 for holding a buff pad (not shown) and an arm 222 for supporting the buff head 221. Typically, the buff head 221 is connected to a shaft 223. Preferably, the buff head 221 is rotatable about a shaft 223. Typically, the arm 222 is configured to swing the buff head 221. The entire front side of the substrate W is cleaned by rotating the substrate W by the rotary table 210 and swinging the buff head 221 by the arm 222. The buff cleaning portion 220 may be configured to be vertically and/or horizontally movable. That is, the cleaning module 200 may have a buff cleaning portion movement mechanism 224 for moving the buff cleaning portion 220 with respect to the substrate W. Since the swinging of the buff head 221 by the arm 222 is also the movement of the buff cleaning portion 220 with respect to the substrate W, the arm 222 may be regarded as the buff cleaning portion movement mechanism 224. The configuration of the buff cleaning portion movement mechanism 224 is not limited to the illustrated example or the example explicitly described, and may have any configuration. The buff pad attached to the buff head 221 may be replaceable. The chemical solution and/or pure water for the buff cleaning may be supplied from the liquid supply mechanism 240, or may be supplied through a liquid supply path (not shown) provided inside the arm 222. Since the substrate W is supported by the rotary table 210, a positional deviation of the substrate W or other problems are unlikely to occur even when the buff cleaning portion 220 presses the substrate W downward. Therefore, the cleaning module 200 according to an embodiment can easily secure a sufficient pressing force between the buff pad and the substrate W, and thus obtain a sufficient cleaning force. The operation of the buff cleaning portion movement mechanism 224 may be controlled by the control unit 160 and/or the control unit 260. The control unit that controls the operation of the buff cleaning portion movement mechanism 224 may be referred to as a "buff cleaning portion control mechanism".

The edge part of the substrate W is cleaned by the edge cleaning portion 230. The edge cleaning portion 230 cleans the edge part of the substrate W while contacting the edge part of the substrate W. The edge cleaning portion 230 according to an embodiment has a first roller 231 and a second roller 232. The first roller 231 is a roller for cleaning the edge part of the front side of the substrate W. The second roller 232 is a roller for cleaning the edge part on the back side of the substrate. More specifically, the side surface of the first roller 231 is brought into contact with the edge part of the front side of the substrate W. In addition, the side surface of the second roller 232 is brought into contact with the edge part of the back side of the substrate W. The directions of the rotation axes of the first roller 231 and the second roller 232 are parallel to the surface of the rotary table 210 that supports the substrate W. More specifically, the directions of the rotation axes of the first roller 231 and the second roller 232 are in a tangential line of the substrate W at the contact portion between the first roller 231 and the second roller 232 and the substrate W. The entire circumference of the edge part of the substrate W is cleaned as the substrate W rotates while the first roller 231 and the second roller 232 is in contact with the edge part of the substrate. Since the rotary table 210 is smaller than the substrate W as described above, the edge cleaning portion 230, particularly the second roller 232, does not interfere with the rotary table 210.

The materials of the first roller 231 and the second roller 232 according to an embodiment may include, for example, PVA (polyvinyl alcohol). PTFE (polytetrafluoroethylene), PCTFE (polychlorotrifluoroethylene), foamable polyurethane, or the like. The first roller 231 and the second roller 232 may have a sponge-like state. The diameters of the first roller 231 and the second roller 232 are, for example, 5 mm to 100 mm. The lengths (roller widths) of the first roller 231 and the second roller 232 are, for example, 5 mm to 100 mm.

As illustrated in FIG. 2A, the first roller 231 may be placed directly over the second roller 232. In other words, the substrate W may be interposed between the first roller 231 and the second roller 232. By interposing the substrate W between the first roller 231 and the second roller 232, it is possible to secure a sufficient pressing force to each substrate W between the first roller 231 and the second roller 232, and thus obtain a sufficient cleaning force.

Figure 3:
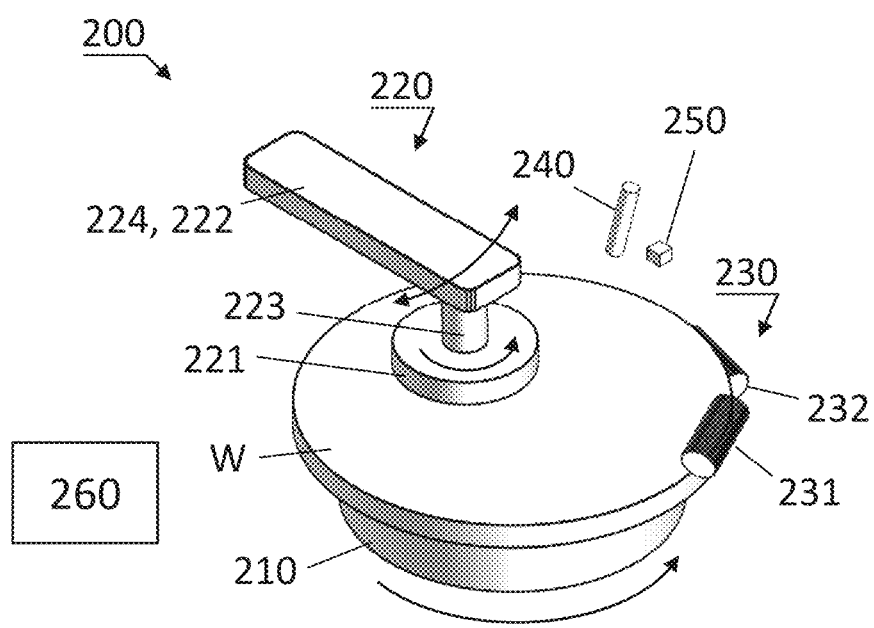
FIG. 3 is a perspective view illustrating a cleaning module according to another embodiment.

Unlike FIG. 2A, the first roller 231 may be placed not directly over the second roller 232. Typically, the cleanliness required for the front side of the substrate W is higher than the cleanliness required for the back side of the substrate W. Therefore, it is not preferable that dirt existing on (the edge part of) the back side adheres to (the edge part of) the front side or the first roller 231. As illustrated in FIG. 3, the first roller 231 may be placed in an upstream of the second roller 232 in the rotation direction. In the configuration of FIG. 3, as the substrate W rotates, a certain edge part of the front side comes into contact with the first roller 231 first. Then, the edge part of the back side of the corresponding portion comes into contact with the second roller 232. In the configuration of FIG. 3, it is possible to prevent the dirt from the second roller 232 from moving to (the edge part of) the front side of the first roller 231 and/or the substrate W. However, the first roller 231 may also be placed in a downstream of the second roller 232 in the rotation direction.

The edge cleaning portion 230 may have a motor for rotating each roller. The rotation speed of the motor connected to the first and/or second rollers 231 and/or 232 may be set to, for example, 0 rpm or higher and 300 rpm or lower. When the rotation speed of the motor is 0 rpm, the first and/or second rollers 231 and/or 232 are stationary or rotating (idling) by friction with the substrate W.

When the first roller 231 is placed directly over the second roller 232, the first roller 231 and the second roller 232 rub against each other. In order to prevent wear of each roller, it is preferable that the rotation speed of the first roller 231 is equal to the rotation speed of the second roller 232. In addition, when the rotation directions of the first roller 231 and the second roller 232 are the same, the first roller 231 and the second roller 232 move in the opposite direction at a contact portion between the first roller 231 and the second roller 232. Therefore, it is considered that the first roller 231 and the second roller 232 are severely worn at the contact portion between the first roller 231 and the second roller 232. In view of the aforementioned fact, the rotation directions of the first roller 231 and the second roller 232 may be opposite to each other. Note that, on the drawings, it seems that there is no contact portion between the first roller 231 and the second roller 232 (see FIG. 2B). However, each roller may be formed of a soft material, and each roller is pressed against the edge part of the substrate W. Therefore, unlike the schematic view of FIG. 2B, the first roller 231 and the second roller 232 may come into contact with each other in an actual device. The rotation directions of the first roller 231 and the second roller 232 may be appropriately switchable as necessary.

Meanwhile, when the first roller 231 and the second roller 232 do not come into contact with each other as illustrated in FIG. 3, no wear occurs between the first roller 231 and the second roller 232. Therefore, from the viewpoint of the roller wear, it is not necessary to determine the rotation speed and/or the rotation direction between the first roller 231 and the second roller 232.

The rotation direction of at least one of the first roller 231 and the second roller 232 according to an embodiment is set to sweep the substrate W outward in the radial direction (see FIG. 2B). By determining the rotation direction as illustrated in FIG. 2B, it is possible to prevent the first roller 231 and the second roller 232 from splashing a dirty cleaning liquid toward the substrate W. Meanwhile, the rotation direction of at least one of the first roller 231 and the second roller 232 may also be set to sweep the substrate W inward in the radial direction. By determining the rotation direction so as to sweep the substrate W inward in the radial direction, it is possible to improve the cleanliness of the side surface (also referred to as the end surface (apex)) of the substrate W. When the rotation direction of the first roller 231 is determined so as to sweep the substrate W inward in the radial direction, the first roller 231 may splash the dirty cleaning liquid toward the front side of the substrate W. However, the front side of the cleaning module 200 according to an embodiment is cleaned by the buff cleaning portion 220. Therefore, the influence of splashing of the cleaning liquid from the first roller 231 is negligible.

Figure 4:
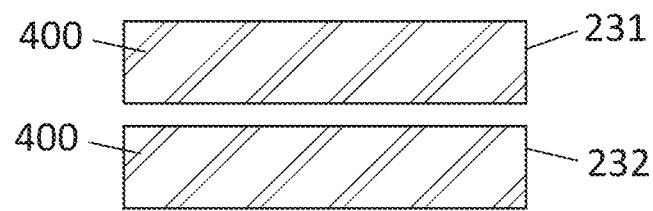
FIG. 4 is a diagram illustrating a groove for drainage from a roller.

As illustrated in FIG. 4, at least one of the first roller 231 and the second roller 232 may have a groove 400. The groove provided in the roller allows a cleaning liquid contaminated by the cleaning to be easily drained from the roller. The shape of the groove 400 is, for example, spiral (see FIG. 4). The direction and the number of spirals, the width and depth of the groove 400, and the like may be appropriately set. In addition, the groove 400 may have an arbitrary shape. A simple hole, such as a circular blind hole, may also be regarded as the "groove" as long as it contributes to drainage from the roller.

The liquid such as a chemical solution and the cleaning liquid for the edge cleaning portion 230 may also be supplied from the liquid supply mechanism 240. Additionally or alternatively, the liquid may be supplied from a liquid supply path provided inside the edge cleaning portion 230.

The cleaning module 200 may have a centering mechanism (not shown) for centering the substrate W and the rotary table 210. However, even using the centering mechanism, it is difficult to center the substrate W and the rotary table 210 without any error. Furthermore, an error may also occur in the shape of the substrate W, the shape of the rotary table 210, or the rotation of the rotary table 210. When any error exists, it may be difficult to uniformly clean the edge part of the substrate W by the edge cleaning portion 230. In this regard, the cleaning module 200 may have a sensor 250. The sensor 250 may be, for example, a sensor that detects the position of the edge part of the substrate W. The sensor 250 illustrated in FIGS. 2 and 3 is an optical sensor arranged in the upper part of the rotary table 210. The sensor 250 may be provided, for example, inside the rotary table 210. The edge of the substrate W can be uniformly cleaned by adjusting the position of the edge cleaning portion 230, specifically, the positions of the first roller 231 and the second roller 232 depending on the position of the edge part of the substrate W detected by the sensor 250. The position adjustment of the edge cleaning portion 230 may be performed based on a feedback control of the control unit 160 and/or the control unit 260. The object controlled by the control unit 160 and/or the control unit 260 may include an edge cleaning portion movement mechanism 500 (first and/or second movement mechanisms 520 and/or 530) described below (see FIG. 5).

The cleaning module 200 according to an embodiment enables all of the buff cleaning of the surface of the substrate W, the cleaning of the edge part of the front side of the substrate W, and the cleaning of the edge part of the back side of the substrate W. Since the substrate W is supported by the rotary table 210, the buff cleaning portion 220 can strongly clean the surface of the substrate W. Since the rotary table 210 is smaller than the substrate W, the edge cleaning portion 230 and the rotary table 210 do not interfere with each other. All of the buff cleaning of the surface of the substrate W, the cleaning of the edge part of the front side of the substrate W, and the cleaning of the edge part of the back side of the substrate W may be performed at the same time. The buff cleaning of the surface of the substrate W, the cleaning of the edge part of the front side of the substrate W, and the cleaning of the edge part of the back side of the substrate W may be performed in any order. In the cleaning module 200 according to an embodiment, the rotary table 210 and the edge cleaning portion 230 are independent of each other. Therefore, it is unlikely that dirt is transferred from the rotary table 210 to the edge cleaning portion 230. When the member for holding the substrate and the member for cleaning the edge are the same, dirt may move from the member for holding the substrate to the member for cleaning the edge. The cleaning module 200 according to an embodiment may be advantageous in terms of the dirt transfer.

Figure 5:
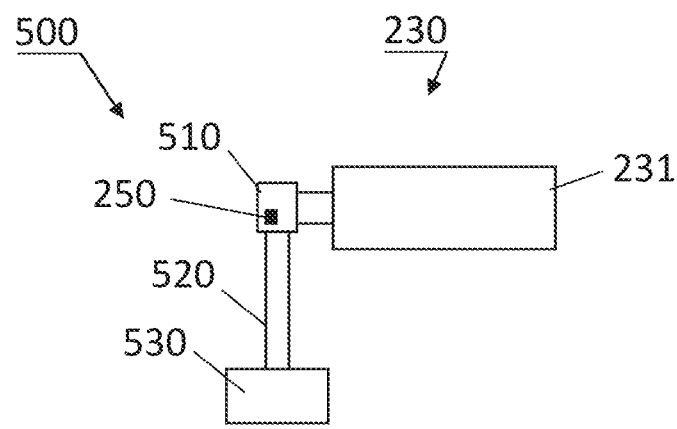
FIG. 5 is a diagram illustrating a movement mechanism for moving at least a part of an edge cleaning portion.

Details of the edge cleaning portion movement mechanism 500 for moving at least a part of the edge cleaning portion 230 will be described with reference to FIG. 5. Although FIG. 5 illustrates the mechanism for the first roller 231, the mechanism for the second roller 232 also has a configuration similar to that of FIG. 5. Therefore, the "first roller 231" in the following description may also be referred to as a "second roller 232".

The first roller 231 is connected to a first movement mechanism 520 that moves the first roller 231 perpendicularly to the surface of the rotary table 210 that supports the substrate W. The first roller 231 is further connected to a second movement mechanism 530 that moves the first roller 231 in a plane parallel to the surface of the rotary table 210 that supports the substrate W. The second movement mechanism 530 moves the first roller 231 so as to approach or recede from the substrate W. Each of the first and second movement mechanisms 520 and 530 may include a pneumatic mechanism, a set of motor and ball screw, or other mechanisms. Note that the configuration of the edge cleaning portion 230 is not limited to the configuration of FIG. 5. A motor 510 may be connected to the first roller 231. However, the motor 510 is not an essential element of the edge cleaning portion movement mechanism 500.

The first movement mechanism 520 is used to adjust the pressing force between the first roller 231 and the substrate W. The second movement mechanism 530 is used to switch the cleaning of the first roller 231 on and off. However, if the movement amount of the first movement mechanism 520 is sufficiently large, it is possible to switch the cleaning on and off by using the first movement mechanism 520. In addition, the shape of the first roller 231 is cylindrical. Therefore, the height of the first roller 231 varies from place to place. Therefore, it is also possible to adjust the pressing force between the first roller 231 and the substrate W by using the second movement mechanism 530.

As described above, when there is an error in the position of the substrate W or the like, the position of the edge part of the rotating substrate W may change. When the position of the edge part of the substrate W changes, the pressing force between the edge cleaning portion 230 and the substrate W may also change. It is considered that the edge part of the substrate W can be uniformly cleaned by detecting the pressing force between the edge cleaning portion 230 and the substrate W and adjusting the position of the first roller 231 so as to maintain the pressing force constant. The edge cleaning portion 230 may also have a sensor 250 that detects a pressing force between the edge cleaning portion 230 and the substrate W. Specifically, the sensor 250 detects the pressing force between the first roller 231 and the substrate W. In FIG. 5, the sensor 250 is provided inside the edge cleaning portion movement mechanism 500. The sensor 250 may also be provided in the rotary table 210. The pressing force is adjusted by adjusting the position of the first roller 231. The position of the first roller 231 is adjusted by the edge cleaning portion movement mechanism 500. The control unit 160 and/or the control unit 260 may perform a feedback control of the edge cleaning portion movement mechanism 500 based on the signal from the sensor 250.

Figure 6A:
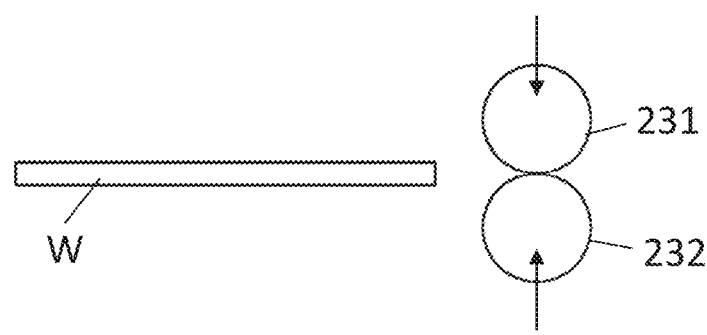
FIG. 6A is a diagram illustrating a first step in a method of controlling a pressing force between the edge cleaning portion and the substrate in advance.
Figure 6B:
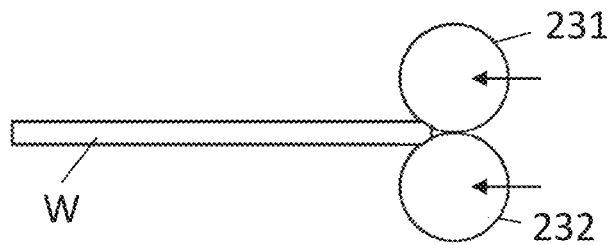
FIG. 6B is a diagram illustrating a second step in the method of controlling the pressing force between the edge cleaning portion and the substrate in advance.

During cleaning of the substrate W, it may be difficult to detect or control the pressing force. In this regard, the pressing force between the edge cleaning portion 230 and the substrate W may be controlled in advance. FIG. 6A is a diagram illustrating a first step of a method of controlling the pressing force between the edge cleaning portion 230 and the substrate W in advance. FIG. 6B is a diagram illustrating a second step of the method. The first roller 231 of FIG. 6 is placed directly over the second roller 232. In the following description, the first roller 231 and the second roller 232 are moved by the edge cleaning portion movement mechanism 500.

In the first step, the first roller 231 is lowered at a position away from the substrate W. Moreover, the second roller 232 is lifted. The first roller 231 and the second roller 232 are moved until they come into contact with each other. The pressing force between the first roller 231 and the second roller 232 is measured by any means such as the sensor 250 of FIG. 5. The pressing force between the edge cleaning portion 230 and the substrate W is calculated from the pressing force between the first roller 231 and the second roller 232. The "pressing force between the edge cleaning portion 230 and the substrate W" may also be referred to as "a pressing force between the first roller 231 and the substrate W and a pressing force between the second roller 232 and the substrate W". The positions of the first roller 231 and the second roller 232 are adjusted by the edge cleaning portion movement mechanism 500 such that the pressing force between the edge cleaning portion 230 and the substrate W reaches a desired value.

When it is calculated that the pressing force between the edge cleaning portion 230 and the substrate W reaches a desired value, the process advances to the second step. In the second step, the first roller 231 and the second roller 232 are moved toward the substrate W, and the first roller 231 and the second roller 232 are brought into contact with the substrate W. Through the steps described above, the pressing force between the edge cleaning portion 230 and the substrate W is controlled in advance. A relationship between the pressing force between the first roller 231 and the second roller 232 and the pressing force between the edge cleaning portion 230 and the substrate W may also be measured in advance. The relationship measured in advance may be stored in any storage device in advance.

In regard to the sensor 250, the sensor 250 may be a sensor that detects the position of the edge part of the substrate W and/or the pressing force between the edge cleaning portion 230 and the substrate W. The control units 160 and/or 260 may cause the edge cleaning portion movement mechanism 500 to move the edge cleaning portion 230 based on the output of the sensor 250 so as to compensate for a positional deviation of the substrate W and/or a change of the pressing force between the edge cleaning portion 230 and the substrate W. The control unit that controls the operation of the edge cleaning portion movement mechanism 500 may be also referred to as an "edge cleaning portion control mechanism". Note that distinction between the "buff cleaning portion control mechanism" and the "edge cleaning portion control mechanism" is merely for convenience purposes. When the control unit can control a plurality of objects, the same control unit may function as both the "buff cleaning portion control mechanism" and the "edge cleaning portion control mechanism". Meanwhile, the control unit for the "buff cleaning portion control mechanism" and the control unit for the "edge cleaning portion control mechanism" may also be provided separately.

Figure 7:
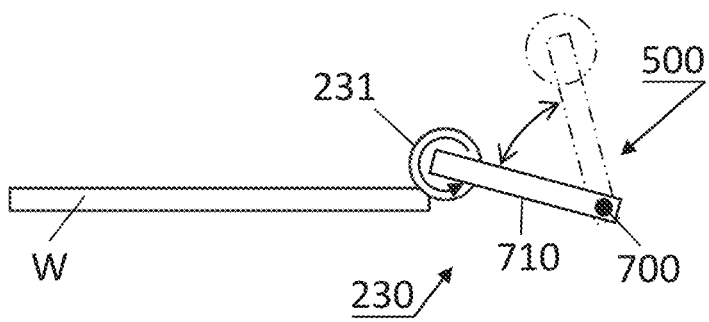
FIG. 7 is a diagram illustrating another example of the movement mechanism for moving at least a part of the edge cleaning portion.

Any other configuration may also be employed instead of the configuration of FIG. 5. FIG. 7 is a diagram illustrating an edge cleaning portion 230 having a pivot mechanism as the edge cleaning portion movement mechanism 500. Only the first roller 231 is shown in FIG. 7. The second roller 232 may also be connected to the edge cleaning portion movement mechanism 500 of FIG. 7. The edge cleaning portion movement mechanism 500 of FIG. 7 has a shaft 700 and an arm 710 which is pivotable around the shaft 700. The edge cleaning portion movement mechanism 500 may have a motor (not shown) for pivoting the arm 710. The first roller 231 is installed to the tip of the arm 710. For example, an extending direction of the shaft 700 is the same as the direction of the rotation axis of the first roller 231. The first roller 231 is pivotally driven by the edge cleaning portion movement mechanism 500 of FIG. 7 and comes into contact with the edge part of the substrate W.

Figure 8:
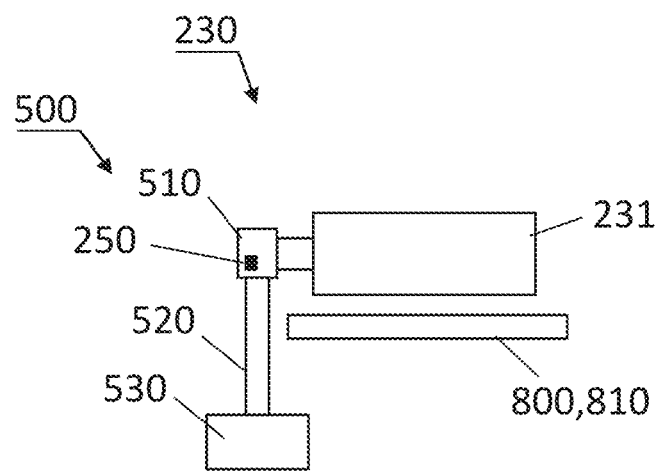
FIG. 8 is a diagram illustrating a cleaner having a quartz plate.

It is considered that the edge cleaning portion 230 becomes dirty as the substrate W is cleaned. In this regard, the substrate treatment device 100, the cleaning module 200, and/or the edge cleaning portion 230 may include a cleaner 800 for the edge cleaning portion 230. An example of the cleaner 800 is illustrated in FIG. 8. The cleaner 800 of FIG. 8 is a quartz plate 810. The first roller 231 is moved to the vicinity of the cleaner 800 by the edge cleaning portion movement mechanism 500 or other mechanisms. Alternatively, the cleaner 800 may be moved to the vicinity of the first roller 231. Further alternatively, the first roller 231 removed from the edge cleaning portion 230 may be moved to the vicinity of the quartz plate 810. The first roller 231 rotates while being pressed against the quartz plate 810. This operation allows cleaning of the first roller 231.

Figure 9:
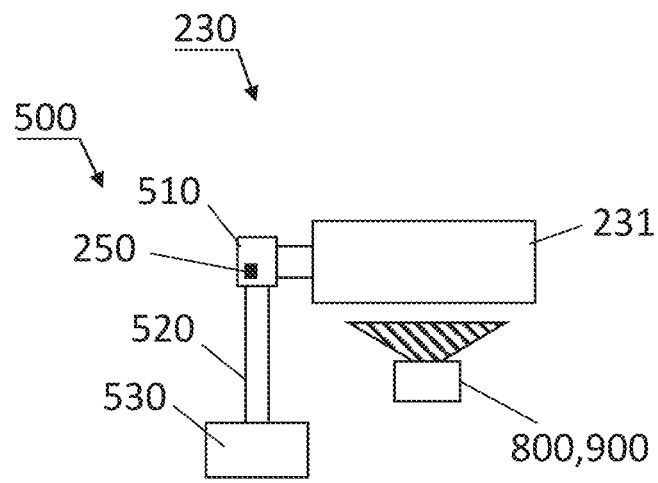
FIG. 9 is a diagram illustrating a cleaner having a nozzle.

Another example of the cleaner 800 is illustrated in FIG. 9. The cleaner 800 of FIG. 9 is a nozzle 900 that injects a cleaning liquid to the first roller 231. The first roller 231 is cleaned by injecting the liquid from the nozzle 900.

Only the first roller 231 is illustrated in FIGS. 8 and 9. However, the second roller 232 may be cleaned by the cleaner 800. Cleaning of the edge cleaning portion 230 by the cleaner 800 may be performed during idling of the cleaning module 200 (while the substrate W is not cleaned by the cleaning module 200).

Figure 10:
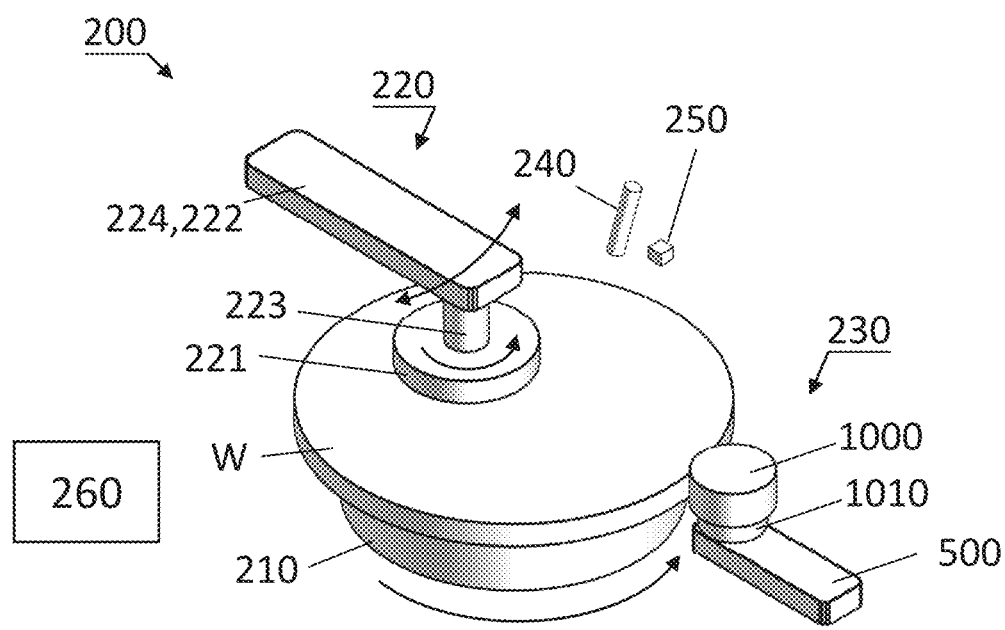
FIG. 10 is a perspective view illustrating a cleaning module having an edge cleaning portion according to a second example.

FIG. 10 illustrates another example of the edge cleaning portion 230. The edge cleaning portion 230 of FIG. 10 has a roller 100X), a motor 1010 for rotating the roller 1000, and an edge cleaning portion movement mechanism 500 for bringing the roller 1000 into contact with the substrate W and separating the roller 1000 from the substrate W. The edge cleaning portion movement mechanism 500 may also adjust the pressing force between the roller 1000 and the substrate W. The direction of the rotation axis of the roller 1000 is in a direction perpendicular to the surface of the rotary table 210 that supports the substrate W. The side surface of the roller 1000 comes into contact with the edge part of the substrate W. Since the roller 1000 may be formed of a soft material as described below, the roller 100) can clean not only the side surface of the substrate W but also the beveled part of the substrate W. In other words, the roller 100) can clean the entire edge part of the substrate W.

The configuration relating to the first roller 231 and the second roller 232 may also be applied to the roller 1000 as long as there is no problem. For example, the material of the roller 1000 may be the same as that of the first roller 231 or the second roller 232. Therefore, the roller 1000 may be formed of a soft material. For example, similar to the first roller 231, a liquid such as a chemical solution or pure water may be supplied from the inside of the roller 1000. In addition, each element such as the sensor 250 and the cleaner 800 may be optimized to adapt to the characteristics of the roller 1000.

The motor 1010 rotates the roller 1000. The rotation speed of the roller 1000 may be appropriately determined. For example, the rotation speed of the roller 1000 may be set to 3 rpm. Note that the rotation speed of the roller 1000 also includes 0 rpm. The rotation direction of the roller 1000 may be appropriately determined. When the rotation direction of the roller 1000 and the rotation direction of the substrate W are the same, the roller 1000 and the substrate W move oppositely at their contact portion so as to improve the cleaning force. Meanwhile, when the rotation direction of the roller 1000 and the rotation direction of the substrate W are opposite to each other, the roller 1000 and the substrate W move in the same direction at the contact portion, so that the wear of the roller 1000 can be reduced.

Figure 11:
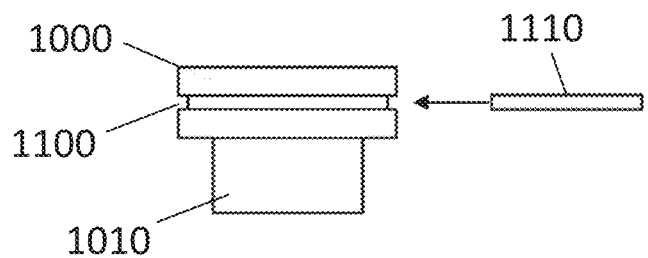
FIG. 11 is a side view illustrating the roller and the conditioner of FIG. 10.

FIG. 11 is a side view illustrating the roller 1000. As illustrated in FIG. 11, it is preferable that a groove 1100 having a shape matching a shape of the edge part of the substrate W is provided on the side surface of the roller 1000. The groove 1100 can allow cleaning for the entire edge part of the substrate W to be more reliably performed.

The substrate processing apparatus 100, the cleaning module 200 and/or the edge cleaning portion 230 may include a conditioner 1110 for conditioning the groove 1100. The shape of the edge part of the conditioner 1110 matches a shape of the edge part of the substrate W. The conditioner 1110 is formed of a material capable of scraping (polishing) the roller 1000. The conditioner 1110 may be rotated by any motor (not shown) or the like. The shape of the groove 1100 is conditioned by rotating the roller 1000 by the motor 1010 while the conditioner 1110 and the groove 1100 come in contact with each other. The conditioner 1110 aims to scrape the groove 1100 to adjust the shape of the groove 1100. Meanwhile, the cleaner 800 does not aim to scrape the object, but aims to clean the object. That is, the cleaner 800 and the conditioner 1110 are different in their purposes. The conditioner 1110 may be used not only to condition the existing groove 1100, but also to form a new groove 1100 in the roller 1000. When conditioning or forming the groove 1100 by using the conditioner 1110, a liquid such as a chemical solution or pure water may be supplied to the groove 1100 or the conditioner 1110 from a nozzle (not shown) or the like. A liquid such as a chemical solution or pure water may be supplied from the inside of the roller 1000.

The cleaning module 200 may have a plurality of rollers 1000. The materials of each of the plurality of rollers 1000 may be different from each other. For example, the cleaning module 200 may include a single roller 1000 formed of a material for rough cleaning and another roller 1000 formed of a material for precision cleaning. In this case, it is preferable that the roller 1000 for rough cleaning is placed in an upstream of the other roller 1000 in the rotation direction of the substrate W.

Figure 12:
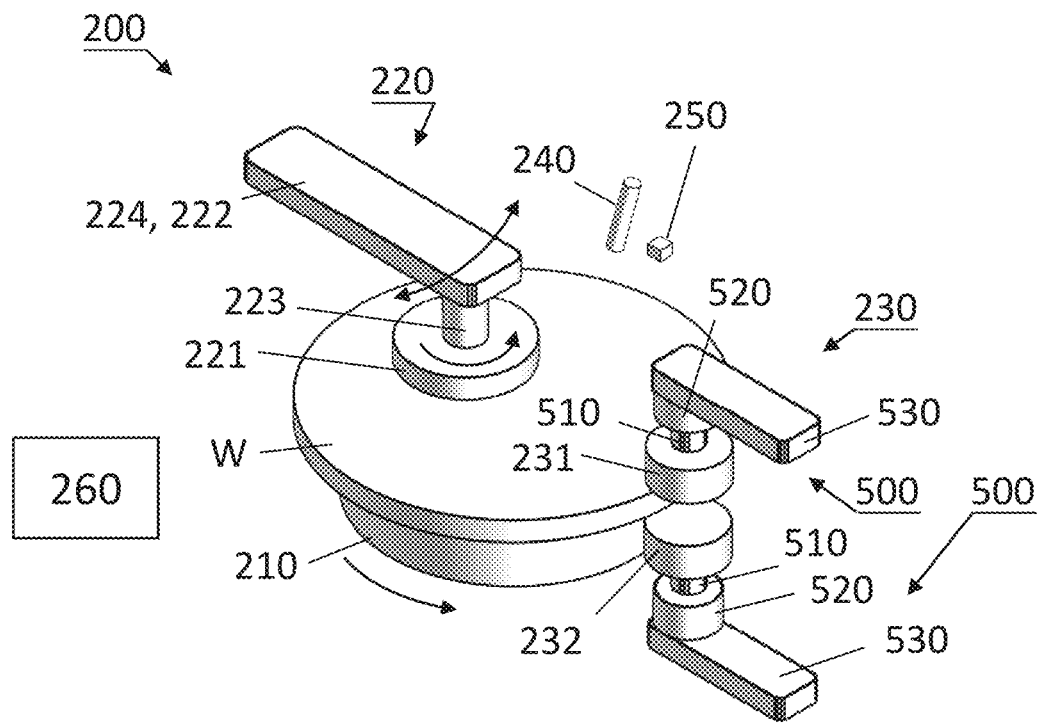
FIG. 12 is a perspective view illustrating a cleaning module having an edge cleaning portion according to a third example.

FIG. 12 illustrates yet another example of the edge cleaning portion 230. The directions of the rotation axes of the first roller 231 and the second roller 232 in FIG. 12 are perpendicular to the surface of the rotary table 210 that supports the substrate W. Each of the first roller 231 and the second roller 232 is connected to the motor 510. The edge part of the front side of the substrate W is cleaned by the bottom surface of the first roller 231. The edge part of the back side of the substrate W is cleaned by the top surface of the second roller 232. Note that, at least referring to FIG. 12, it may be considered that the side surface of the substrate W is not cleaned. However, the typical substrate W is relatively thin, and the typical first roller 231 and the second roller 232 are soft. Therefore, even in the configuration of FIG. 12, the side surface of the substrate W can be cleaned. In the example of FIG. 12, the first roller 231 is arranged directly over the second roller 232. Instead, as illustrated in FIG. 3, the first roller 231 may be arranged in an upstream of the second roller 232 in the rotation direction.

The diameters of the first roller 231 and the second roller 232 are set to, for example, 30 mm, but not limited thereto. The materials of the first roller 231 and the second roller 232 may be similar to each other. Each of the first roller 231 and the second roller 232 may be connected to the edge cleaning portion movement mechanism 500 similar to that of FIG. 5. Alternatively, as illustrated in FIG. 7, an edge cleaning portion movement mechanism 500 that pivots the first roller 231 and the second roller 232 may also be employed.

The rotation speeds of the first roller 231 and the second roller 232 may be arbitrarily determined, and may be set to, for example, 500 rpm or lower. Since the first roller 231 and the second roller 232 can come into contact with each other, it is preferable to determine the rotation speeds and rotation directions of the first roller 231 and the second roller 232 so as to prevent the first roller 231 and the second roller 232 from sliding and wearing. However, this does not apply when the first roller 231 is not placed directly over the second roller 232.

Figure 13:
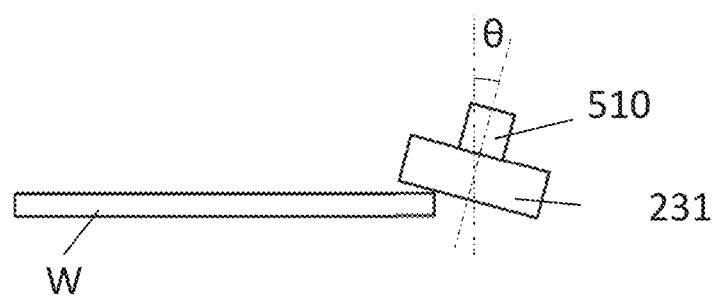
FIG. 13 is a side view illustrating the roller of FIG. 12.

As illustrated in FIG. 13, the rotation axis of the first roller 231 or the rotation axis of the second roller 232 may be tilted from the direction perpendicular to the surface of the substrate W. When the rotation axis of the roller is tilted, the bottom surface of the first roller 231 or the top surface of the second roller 232 comes into contact with the substrate W at an inclined angle. Then, the first roller 231 or the second roller 232 easily comes into contact with the beveled part of the substrate W. As a result, it is possible to improve the cleaning performance of the cleaning module 200. The tilt angle θ of the motor 510 may be, for example, 0° or larger and 25° or smaller. When the first roller 231 is arranged directly over the second roller 232, and the tilt angle θ increases, a part of the first roller 231 and a part of the second roller 232 are strongly pressed against each other. Therefore, when the tilt angle θ is large, it is preferable that the first roller 231 is not arranged directly over the second roller 232.

A liquid such as a chemical solution or pure water may be supplied from the liquid supply mechanism 240, or may be supplied via a liquid supply path provided inside the first roller 231 or the second roller 232. The sensor 250 or the cleaner 800 may be optimized to adapt to the configuration of FIG. 12.

Figure 14:
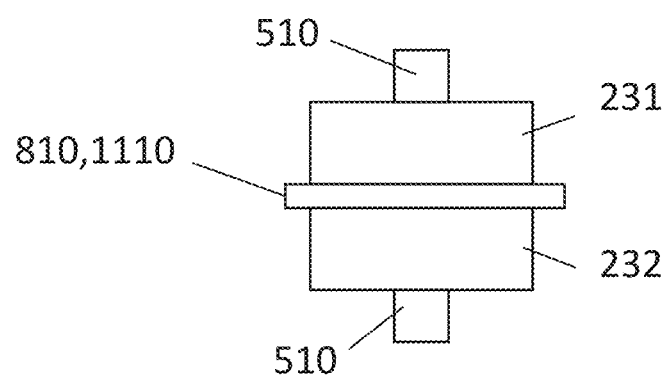
FIG. 14 is a side view illustrating the quartz plate or the conditioner for the roller of FIG. 12.

As illustrated in FIG. 14, the cleaning module 200 may be configured such that the quartz plate 810 or the conditioner 1110 is interposed vertically between by the first roller 231 and the second roller 232. The quartz plate 810 or the conditioner 1110 simultaneously cleans or scrapes the bottom surface of the first roller 231 and the top surface of the second roller 232.

Some embodiments of the present invention have been described hereinbefore. The aforementioned embodiments of the invention are intended to facilitate the understanding of the present invention, and are not to limit the scope of the invention. The present invention may be changed or modified without departing from the spirit of the present invention. Naturally, the present invention includes the equivalents thereof. Any combination or omission for the elements described in the claims and specification may be possible as long as at least a part of the aforementioned problems can be addressed, or at least a part of the effects are exhibited.

According to an embodiment of the present invention, there is disclosed a cleaning module including: a rotary table configured to support a circular substrate and have a diameter smaller than a diameter of the substrate; a buff cleaning portion configured to buff clean a front side of the substrate while contacting the front side of the substrate supported by the rotary table; a buff cleaning portion movement mechanism configured to move the buff cleaning portion with respect to the substrate; a buff cleaning portion control mechanism configured to control an operation of the buff cleaning portion movement mechanism; and an edge cleaning portion configured to clean an edge part of the substrate while contacting the edge part of the substrate supported by the rotary table.

As an advantageous effect, for example, this cleaning module can perform both buff cleaning of the surface of the substrate and cleaning of the edge part of the substrate.

Furthermore, according to an embodiment of the present invention, the edge cleaning portion includes a first roller configured to clean an edge part of a front side of the substrate, and a second roller configured to clean an edge part of a back side of the substrate. Furthermore, according to an embodiment of the present invention, directions of rotation axes of the first roller and the second roller are parallel to a surface of the table that supports the substrate, a side surface of the first roller is in contact with the edge part of the front side of the substrate, and a side surface of the second roller is in contact with the edge part of the back side of the substrate. Furthermore, according to an embodiment of the present invention, the direction of the rotation axis of the first roller is in a tangential line of the substrate at a contact portion between the first roller and the substrate, and the direction of the rotation axis of the second roller is in a tangential line of the substrate at a contact portion between the second roller and the substrate. Furthermore, according to an embodiment of the present invention, the directions of the rotation axes of the first roller and the second roller are tilted by 0° or larger and 25° or smaller from a direction perpendicular to a surface of the table that supports the substrate, a bottom surface of the first roller is in contact with the edge part of the front side of the substrate, and a top surface of the second roller is in contact with the edge part of the back side of the substrate. Furthermore, according to an embodiment of the present invention, the edge cleaning portion includes a roller, a direction of a rotation axis of the roller is perpendicular to a surface of the table that supports the substrate, and a side surface of the roller is in contact with an edge part of the substrate.

In the disclosures described above, details of the edge cleaning portion become apparent.

Furthermore, according to an embodiment of the present invention, the rotation direction of the first roller is set to sweep the substrate inward in a radial direction.

As an advantageous effect, for example, this cleaning module can more effectively clean the side surface of the substrate. Note that, since a liquid splashed from the roller is buff cleaned, influence of the splashed liquid to the substrate is negligible.

Furthermore, according to an embodiment of the present invention, the rotation direction of the first roller is switchable between a direction configured to sweep the substrate inward in the radial direction and a direction configured to sweep the substrate outward in the radial direction.

As an advantageous effect, for example, this cleaning module can appropriately determine a rotation direction of the roller as necessary.

Furthermore, according to an embodiment of the present invention, the first roller is placed directly over the second roller.

As an advantageous effect, for example, this cleaning module can more effectively clean the substrate by interposing the substrate between the rollers.

Furthermore, according to an embodiment of the present invention, the first roller is placed in an upstream of the second roller in a rotation direction of the substrate.

As an advantageous effect, for example, this cleaning module can maintain the first roller and the (edge part of) front side of the substrate clean.

Furthermore, according to an embodiment of the present invention, the roller has a groove having a shape matching a shape of the edge part of the substrate on the side surface.

As an advantageous effect, for example, this cleaning module can more reliably clean the edge part of the substrate.

Furthermore, according to an embodiment of the present invention, the cleaning module has a conditioner for conditioning the shape of the groove.

As an advantageous effect, for example, this cleaning module can maintain the shape of the groove on the side surface of the roller constant.

Furthermore, according to an embodiment of the present invention, the cleaning module further has an edge cleaning portion movement mechanism for moving at least a part of the edge cleaning portion.

As an advantageous effect, for example, this cleaning module can switch on and off cleaning of the edge cleaning portion and/or adjust the pressing force between the edge cleaning portion and the substrate.

Furthermore, according to an embodiment of the present invention, the cleaning module further includes: an edge cleaning portion control mechanism; and a sensor configured to detect a position of the edge part of the substrate and/or a pressing force between the edge cleaning portion and the substrate, wherein the edge cleaning portion control mechanism controls an operation of the edge cleaning portion movement mechanism based on an output of the sensor so as to compensate for a positional deviation of the substrate and/or a change of the pressing force between the edge cleaning portion and the substrate.

As an advantageous effect, for example, this cleaning module can allow uniform cleaning of the edge cleaning portion.

Furthermore, according to an embodiment of the present invention, there is disclosed a substrate processing apparatus including: a polishing portion configured to polish a substrate; the cleaning module disclosed herein; and a transfer mechanism configured to transfer the substrate between the polishing portion and the cleaning module.

In this disclosure, an apparatus to which the cleaning module disclosed herein is applied becomes apparent.

Furthermore, according to an embodiment of the present invention, there is disclosed a method of forming a groove on a side surface of the roller in the cleaning module, the method including scraping a side surface of the roller by using a conditioner having a shape matching a shape of the edge part of the substrate.

In this disclosure, a novel method for preparing a groove in the roller is described.

REFERENCE SIGNS LIST 100 substrate processing apparatus
110 load/unload portion
111 FOUP
112 transfer robot
120 polishing portion
121 first polishing device
122 second polishing device
123 third polishing device
124 fourth polishing device
130 wafer station
140 substrate transfer unit
150 substrate cleaning portion
151 first cleaning module
152 second cleaning module
153 third cleaning module
154 first cleaning portion transfer robot
155 second cleaning portion transfer robot
160, 260 control unit
200 cleaning module
210 rotary table
220 buff cleaning portion
221 buff head
222 arm
223 shaft
224 buff cleaning portion movement mechanism
230 edge cleaning portion
231 first roller
232 second roller
240 liquid supply mechanism
250 sensor
400 groove
500 edge cleaning portion movement mechanism
510 motor
520 first movement mechanism
530 second movement mechanism
700 shaft
710 arm
800 cleaner
810 quartz plate
900 nozzle
1000 roller
1010 motor
1100 groove
1110 conditioner
W substrate

The invention claimed is:

1. A cleaning module comprising:
a rotary table configured to support a circular substrate and have a diameter smaller than a diameter of the substrate;
a buff cleaning portion configured to buff clean a front side of the substrate while contacting the front side of the substrate supported by the rotary table;
a buff cleaning portion movement mechanism configured to move the buff cleaning portion with respect to the substrate;
a buff cleaning portion control mechanism configured to control an operation of the buff cleaning portion movement mechanism; and
an edge cleaning portion configured to clean an edge part of the substrate while contacting the edge part of the substrate supported by the rotary table,
wherein the edge cleaning portion includes:
a first roller configured to clean an edge part of a front side of the substrate; and
a second roller configured to clean an edge part of a back side of the substrate.

2. The cleaning module according to claim 1, wherein directions of rotation axes of the first roller and the second roller are parallel to a surface of the table that supports the substrate,
a side surface of the first roller is in contact with the edge part of the front side of the substrate, and
a side surface of the second roller is in contact with the edge part of the back side of the substrate.

3. The cleaning module according to claim 2, wherein the direction of the rotation axis of the first roller is in a tangential line of the substrate at a contact portion between the first roller and the substrate, and
the direction of the rotation axis of the second roller is in a tangential line of the substrate at a contact portion between the second roller and the substrate.

4. The cleaning module according to claim 3, wherein the rotation direction of the first roller is set to sweep the substrate inward in a radial direction.

5. The cleaning module according to claim 3, wherein the rotation direction of the first roller is switchable between a direction configured to sweep the substrate inward in a radial direction and a direction configured to sweep the substrate outward in the radial direction.

6. The cleaning module according to claim 1, wherein the directions of the rotation axes of the first roller and the second roller are tilted by 0° or larger and 25° or smaller from a direction perpendicular to a surface of the table that supports the substrate,
a bottom surface of the first roller is in contact with the edge part of the front side of the substrate, and
a top surface of the second roller is in contact with the edge part of the back side of the substrate.

7. The cleaning module according to claim 1, wherein the first roller is placed directly over the second roller.

8. The cleaning module according to claim 1, wherein the first roller is placed in an upstream of the second roller in a rotation direction of the substrate.

9. A cleaning module comprising:
a rotary table configured to support a circular substrate and have a diameter smaller than a diameter of the substrate;
a buff cleaning portion configured to buff clean a front side of the substrate while contacting the front side of the substrate supported by the rotary table;
a buff cleaning portion movement mechanism configured to move the buff cleaning portion with respect to the substrate;
a buff cleaning portion control mechanism configured to control an operation of the buff cleaning portion movement mechanism; and an edge cleaning portion configured to clean an edge part of the substrate while contacting the edge part of the substrate supported by the rotary table,
wherein the edge cleaning portion includes a roller,
a direction of a rotation axis of the roller is perpendicular to a surface of the table that supports the substrate, and
a side surface of the roller is in contact with an edge part of the substrate,
the roller has a groove having a shape matching a shape of the edge part of the substrate on the side surface,
the cleaning module has a conditioner for conditioning the shape of the groove.

10. A cleaning module comprising:
a rotary table configured to support a circular substrate and have a diameter smaller than a diameter of the substrate;
a buff cleaning portion configured to buff clean a front side of the substrate while contacting the front side of the substrate supported by the rotary table;
a buff cleaning portion movement mechanism configured to move the buff cleaning portion with respect to the substrate;
a buff cleaning portion control mechanism configured to control an operation of the buff cleaning portion movement mechanism;
an edge cleaning portion configured to clean an edge part of the substrate while contacting the edge part of the substrate supported by the rotary table;
an edge cleaning portion movement mechanism for moving at least a part of the edge cleaning portion;
an edge cleaning portion control mechanism; and
a sensor configured to detect a position of the edge part of the substrate and/or a pressing force between the edge cleaning portion and the substrate, wherein
the edge cleaning portion control mechanism controls an operation of the edge cleaning portion movement mechanism based on an output of the sensor so as to compensate for a positional deviation of the substrate and/or a change of the pressing force between the edge cleaning portion and the substrate.

11. A substrate processing apparatus comprising:
a polishing portion configured to polish a substrate;
a cleaning module; and
a transfer mechanism configured to transfer the substrate between the polishing portion and the cleaning module,
the cleaning module comprising:
a rotary table configured to support a circular substrate and have a diameter smaller than a diameter of the substrate;
a buff cleaning portion configured to buff clean a front side of the substrate while contacting the front side of the substrate supported by the rotary table;
a buff cleaning portion movement mechanism configured to move the buff cleaning portion with respect to the substrate;
a buff cleaning portion control mechanism configured to control an operation of the buff cleaning portion movement mechanism; and
an edge cleaning portion configured to clean an edge part of the substrate while contacting the edge part of the substrate supported by the rotary table.

12. A method of forming a groove on a side surface of the roller in a cleaning module,
the cleaning module comprising:
a rotary table configured to support a circular substrate and have a diameter smaller than a diameter of the substrate;
a buff cleaning portion configured to buff clean a front side of the substrate while contacting the front side of the substrate supported by the rotary table;
a buff cleaning portion movement mechanism configured to move the buff cleaning portion with respect to the substrate;
a buff cleaning portion control mechanism configured to control an operation of the buff cleaning portion movement mechanism; and
an edge cleaning portion configured to clean an edge part of the substrate while contacting the edge part of the substrate supported by the rotary table,
wherein the edge cleaning portion includes a roller,
a direction of a rotation axis of the roller is perpendicular to a surface of the table that supports the substrate, and
a side surface of the roller is in contact with an edge part of the substrate,
the cleaning method comprising scraping a side surface of the roller by using a conditioner having a shape matching a shape of the edge part of the substrate.

* * * * *